United States Patent [19]

Massey

[11] 4,241,311
[45] Dec. 23, 1980

[54] DIGITAL MAJORITY NOISE FILTER FOR BI-LEVEL DATA RECEPTION

[75] Inventor: Raymond P. Massey, Raleigh, N.C.

[73] Assignee: Telex Computer Products, Inc., Tulsa, Okla.

[21] Appl. No.: 8,750

[22] Filed: Feb. 1, 1979

[51] Int. Cl.³ .......................... H03K 5/05; H03K 13/32
[52] U.S. Cl. .................................... 328/167; 328/109; 328/151; 329/104
[58] Field of Search ............... 328/109, 142, 151, 162, 328/165, 167; 329/104

[56] References Cited

U.S. PATENT DOCUMENTS

| | | | |
|---|---|---|---|
| 3,493,874 | 2/1970 | Finkel et al. | 328/165 X |
| 3,571,712 | 3/1971 | Hellwarth et al. | 329/104 X |
| 3,639,848 | 2/1972 | Elliott | 328/167 |
| 3,659,086 | 4/1972 | Metcalf | 328/151 X |
| 3,815,033 | 6/1974 | Tewksbury | 329/104 |
| 3,938,052 | 2/1976 | Glasson et al. | 328/109 X |

*Primary Examiner*—John S. Heyman
*Attorney, Agent, or Firm*—Head & Johnson

[57] ABSTRACT

Apparatus for filtering high frequency noise pulses from alternating analog data of a frequency F, which includes means to convert the analog signal to a square wave bi-level signal, sampling the square wave signal at a clock frequency of at least 8F, loading the sampled signals into a digital shift register at the clock rate, reading out in parallel at least the last three samples, and passing said samples to a majority gate, which outputs a signal representing the majority polarity of the three signals read. The output of the majority gate is then applied to a latch in synchronism with the clock signal, which converts it back to a square wave signal representing the noise filtered version of the input signal.

12 Claims, 3 Drawing Figures

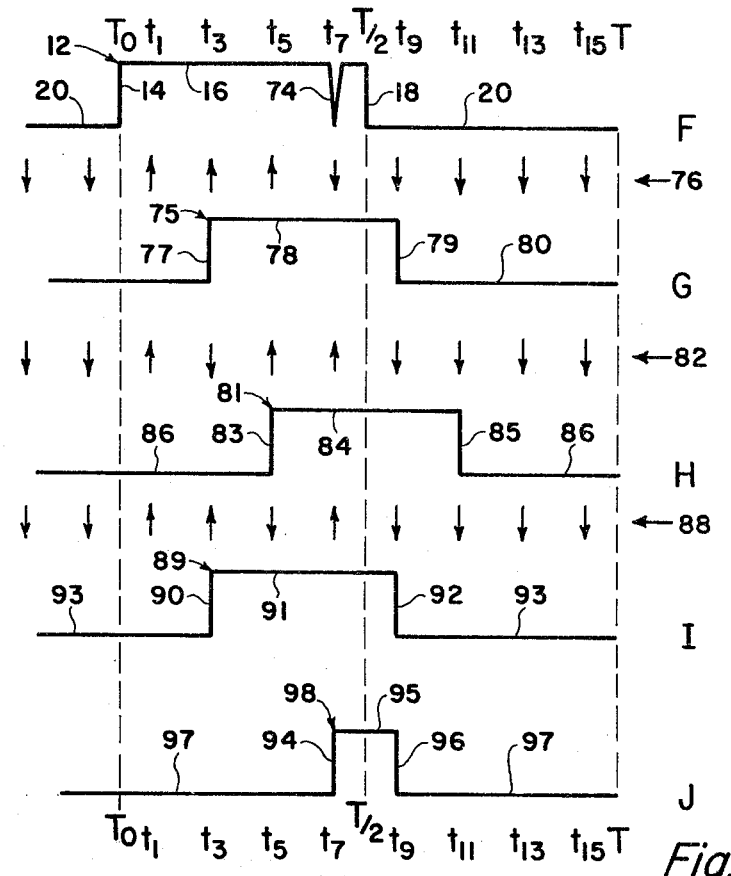
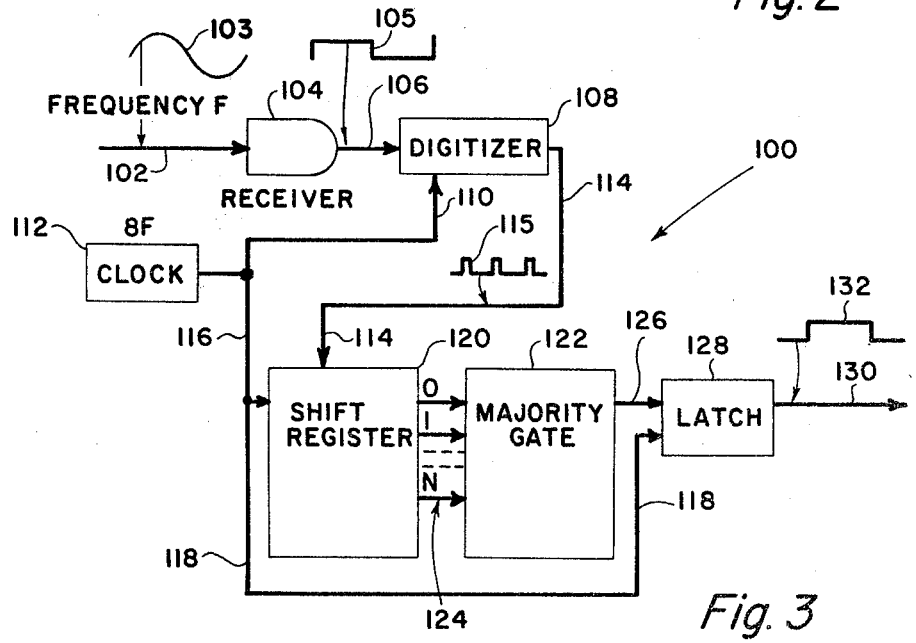
Fig. 2
Fig. 3

DIGITAL MAJORITY NOISE FILTER FOR BI-LEVEL DATA RECEPTION

BACKGROUND OF THE INVENTION

1. Field of the Invention

This invention lies in the field of signal transmission and detection. More particularly, it concerns a method of filtering high frequency noise pulses from an alternating analog signal.

2. Description of the Prior Art

In previous data receivers for receiving alternating analog data in combination with noise pulses, it has been customary to separate the noise from the signal on the basis of frequency, with an analog filter. The received data were then converted to the proper signal levels required by the rest of the system. If any noise passed through the filter, the noise was also passed through the rest of the system. This noise could cause erroneous results.

SUMMARY OF THE INVENTION

It is a primary object of this invention to provide method and apparatus for noise filtering high frequency pulses from alternating analog data.

These and other objects are realized and the limitations of the prior art are overcome in this invention, by converting the received analog signal to a bi-level or square wave signal, and then sampling the square wave signal at a clock frequency of at least eight times the frequency of the analog signal. The stream of signal samples is then loaded into a serial-in, parallel-out digital shift register at the rate of the clock signal. A selected sequence and number of samples entered into the shift register are read out simultaneously and into a majority gate which outputs a signal of polarity which corresponds to the polarity of the majority of the signals simultaneously read in, namely, the polarity of two of the three simultaneous samples read into the majority gate. The output of the majority gate is then passed to a latch in synchronism with the clock signal. This converts the digitized pulses back to a square wave, which represents a digital majority noise filtered version of the incoming analog signal.

With this digital majority noise filter, all filtering would be done by digital methods. This type of filtering is particularly useful in bi-level data reception because the important point is in using data at a particular instant in time, to de-modulate the incoming signal.

This apparatus both synchronizes and digitally filters the data so that during de-modulation, the correct filtered data is available. As will be described, noise pulses are filtered out of the processed signal on the basis of their occurrence at times other than the specific time instants of digitation. In the event that noise pulses occur at the specific times of sampling of the bi-level signal, this may tend to lengthen or shorten the width of the filtered signal. However, this is acceptable so long as the de-modulation of the filter signal occurs at a specific time which is synchronized with the input signal to occur at a time one-half cycle from the start of the positive half cycle of the input analog data.

The effectiveness of this method of filtering is based upon the fact that noise pulses are extremely high frequency, and therefore, by digitally sampling the bi-level signal, statistically most of the noise pulses will not occur at the instant of sampling. Therefore, they have no effect on the resulting processed signal.

BRIEF DESCRIPTION OF THE DRAWINGS

These and other objects and advantages of the invention and a better understanding of the principles and details of the invention will be evident from the following description taken in conjunction with the appended drawings, in which:

FIG. 2 illustrates the effect of the noise pulses on the effective width of the sampled filtered signal, and of the necessity for precise timing of the de-modulation of the filtered signal.

FIG. 3 illustrates one embodiment of the filtering circuit.

DESCRIPTION OF THE PREFERRED EMBODIMENT

Figure 1:
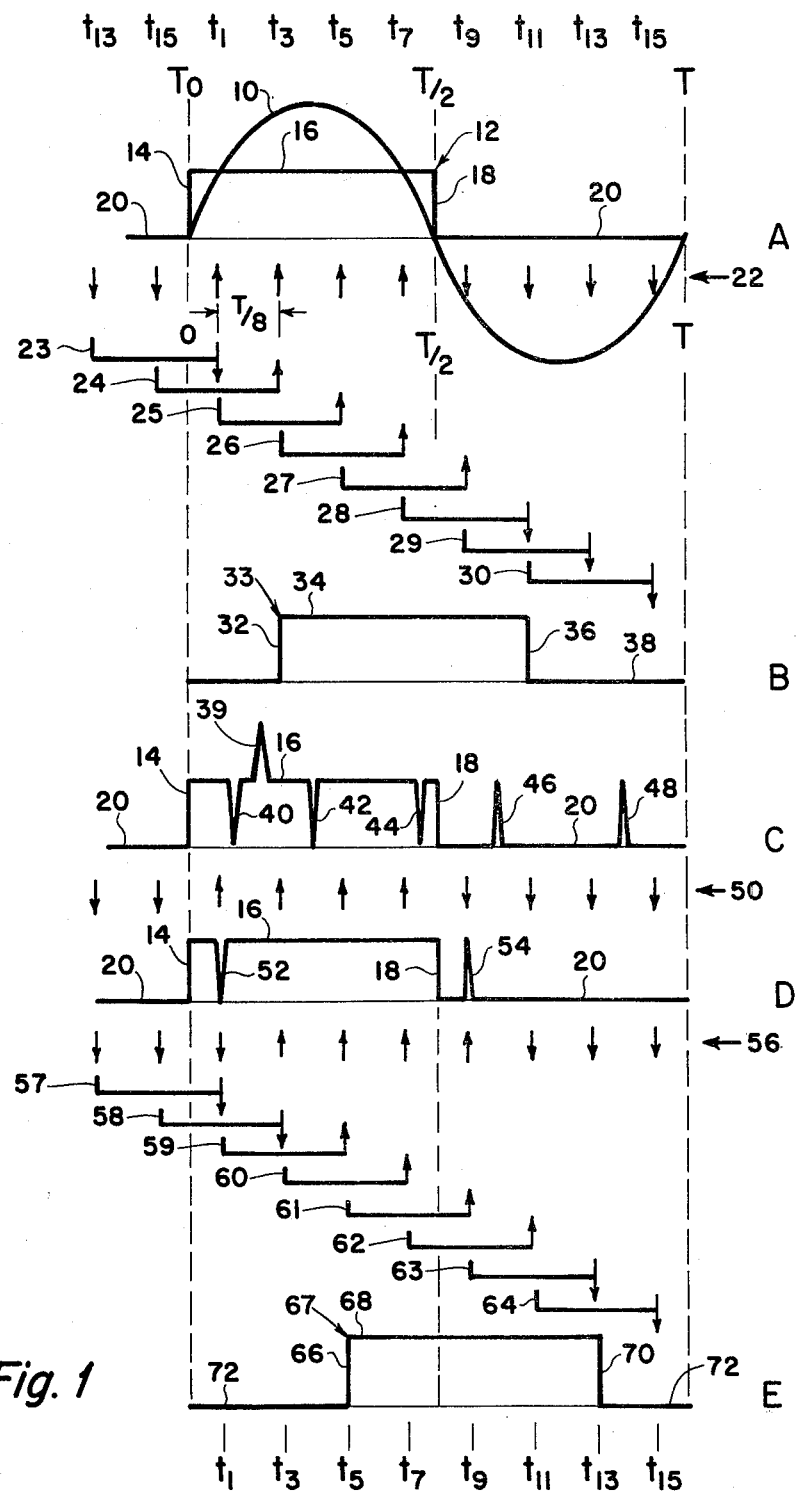
FIG. 1 illustrates how noise pulses that are not synchronous with the sampling times are filtered out of the processed signal.

Referring now to the drawings and in particular to FIGS. 1 and 3, there is shown in line A of FIG. 1 a more or less sinusoidal analog signal 10 which might be inputted to the filter of this invention. The signal 10 is first converted to a bi-level or square wave signal 12 which has a rise portion 14, which starts at the zero crossing time of the analog signal 10, reaches a portion of constant amplitude 16; and then at the second zero crossing time T/2 of the analog signal, drops down to zero in portion 18, and remains zero according to portion 20 of the bi-level signal, until a time T which represents the period of the input signal.

As will be described in FIG. 3, a clock is provided of frequency at least eight times the frequency F of the analog signal 10 and which is preferably synchronized with this incoming signal 10, to be symmetrical in each of the half cycles, as shown by the line of arrows 22, although this is not required. Each of the arrows represents a sample.

The bi-level signal 12 is then sampled at each pulse of the clock, and the samples are indicated in time by the arrows 22 and the direction of the arrow indicates the polarity of the sampled signal at each of the sampling times.

The sample signals are then loaded into a digital shift register, serial-in, parallel-out, and a selected number of samples in the register are read out simultaneously to a majority gate. The action of the majority gate is to compare the polarity of each of the sampled signals read out, and to output a signal of its own, which represents the polarity of the majority of the input sampled signals. This type of action is illustrated by the groupings 23, 24, 25 . . . 30. 23 illustrates the sum of three pulses, two of which are negative, and the third one occurring later in time is positive. The majority gate would, reading these three sampled pulses, show a negative arrow, indicating negative polarity, and so the output of the majority gate at that instant would be negative. Grouping 24 illustrates again the next successive three sampled signals occurring at t15, t1, and t3 and finds two positive and one negative, so that the majority gate would indicate a positive arrow at t3, and so on.

The output of the majority gate is sent to a latch which is synchronized with the clock pulse so that at time t1 the latch is set negative and the output of the latch then illustrated is as curve B at time t1 showing a zero value. At time t3 the arrow is positive, and thus the output of the latch would then be a rising portion 32. Similarly, the sum of the three sample signals at times t1, t3, and t5 would again be positive, as shown by 25. 26 again would show three positive samples with a majority gate output positive. Thus, the latch would stay positive during the time 34 of curve B, until a time t11 and grouping 28, where the majority of the signals t7, t9, and t11 are negative, and then the latch output would drop, according to line 36, to zero value 38, and then in accordance with 28, 29, and 30, would remain zero from then on to the end of the cycle, and time T. Thus, the curve 33 shown in B is the filtered version of the curve 12 of A which is of the same time length, but is displaced in time by 1 ½ clock intervals, each T/8 in length.

What is important in de-modulating the filtered signal 33 is that by detecting the output filtered signal, one must be able to detect each of the positive half cycles of the signal 10. Even though the filtered square wave is not synchronous with the incoming signal, so long as a time is determined when the filtered signal 33 can be detected, indication is thereby provided of the presence of the positive half cycle of the analog signal 10.

In curve C of FIG. 1 is shown the square wave signal 12, with a number of noise pulses superimposed thereon, such as, the negative pulses 40, 42, 44, and the positive pulses 46 and 48. It will be clear, of course, that if a positive pulse such as 39, for example, occurs at the time when the bi-level signal is itself positive, then it can do no harm and does not pass through. It is only the negative pulses 40, 42, 44, for example, that can affect the filtered signal, and only if the time of occurrence of the noise pulse such as 40 is exactly the instant at which the curve 12 is sampled. All of the noise spikes in curve C as shown would not be passed through the filter, since none of them occur at the specific time of the sampling, which are represented by the arrows 50.

Referring now to curve D, two noise pulses are shown, a negative pulse 52 at time t1, and a positive pulse 54 at time t9. The corresponding arrows in the row 56 illustrate that at time t1, for example, the sample would be zero because of the presence of the negative noise pulse 52, whereas in curve 12 the sample would be positive at that time. Following through the procedure of the majority gate illustrated by 57, 58, 59 . . . 64, the filtered version 67 in curve E is shown, which can be compared to the filtered version 33 when there are no noise pulses, in curve B.

It will be evident that the noise pulse 52 has caused the filtered signal 67 to rise later, with the rise portion 66 occurring at time t5 instead of t3. The presence of the second noise pulse 54 causes an extension from t11 to t13 of the falling portion 70 of the filtered signal, down to the zero value 72.

Referring now to FIG. 2, there are some additional representatives of noisy input signals and filtered output signals. For example, in curve F there is a noise pulse 74 at time t7 which causes a shortening on the late portion of the filtered signal 75 shown in row G of FIG. 2.

Not shown, but similar to curve F, is a square wave signal having a noise pulse at time t3. This is indicated by the row of arrows 82 and the presence of this zero sample at time t3. The effect of this noise pulse is to delay the beginning of the output signal 81 just as in FIG. 1, rows D and E, the noise pulse 52 at time t1 delayed the signal 67. Row I shows the resulting filtered signal 89 resulting from a noise pulse occurring in the square wave signal at time t5 as shown by arrows 88. This noise pulse at time t5 effectively shortens the signal 89 by forming the down portion 92 of the curve 89 at time t9.

In the group of curves E, G, H, and I, the effect of the filtering has been indicated for noise pulses occurring separately at all four positions t1, t3, t5, and t7, during the positive portion of the curve 12 of F. While the signals 67, 75, 81, 89 are all delayed and shortened, they all show a positive portion. In will be clear, therefore, that if the filtered signal is sampled during the time between t7 and t9 as shown by the curve 98 in row J, that an indication will be given of a positive polarity, indicative of the positive portion 16 of the curve 12.

FIGS. 1 and 2 clearly illustrate the beneficial effect of this method of digital majority filtering a noise pulses for bi-level data. Reference is now made to FIG. 3 which illustrates one embodiment of a circuit for carrying out this type of filtering.

An input line 102 in FIG. 3 carries an input alternating signal 103 corresponding to 10 of FIG. 1. This goes to a receiver 104, such as a Schmidt trigger, which converts the signal 103 into a square wave bi-level signal 105 corresponding to 12 of FIG. 1 on line 106. This signal 105 goes to a digitizer 108. Here the signal 105 is sampled at times corresponding to the pulses of the clock 112, which are at a frequency at least eight times the frequency F of the input signal 103. The sampled pulses created in the digitizer go by way of line 114 and in accordance with the signal 115 to a shift register 120. This reads the samples into the shift register in synchronism with the clock pulses received on line 116, from the clock 112.

A majority gate 122 reads out of the shift register, in parallel, over leads 124, a plurality of sample values. Any sequence of outputs may be fed to the majority gate 122. The sequence of outputs fed to the majority gate would depend on the signal being filtered, and what filtering action one was looking at. Moreover, the output of the digital shift register may be inverted before it is sent to the majority gate. As a result, instead of looking for 2 out of 3 ones, for example, for active compare, one could look for a one and a zero for an active compare, where an inverted zero is one. The action of the majority gate 122 is to compare the polarity of each of the samples on the lines 124 such as, for example, the last three samples loaded into the shift register, and to determine which polarity is represented by a majority of the samples. That polarity is outputted on line 126 to a latch 128.

The latch 128, which can be, for example, a digital flip-flop, is timed with the clock pulses on line 118 and stays latched during the time interval between successive clock pulses maintaining the polarity on the output line 130 to be that of the last output signal on lines 126 from the majority gate. The line 130 then will output a square wave signal 132 which is the filtered version of the input square wave signal 105. The output of the latch 128 comprises the filtered data synchornized to the clock. This filtered signal, while it may not agree in width to the input signal 12, is adequate for bi-level data modulation, provided that it is detected at the proper time instant. The effective filtered signal would then be used in the remaining part of the signal processing system (not shown).

It will be clear that this bi-level digital majority noise filtering system can, of course, be used with different clock frequencies, depending upon the frequency of the incoming signal and the accuracy of the filtering desired. Also, for increased filtering effectiveness, 5, 7, 9, or other majority gates may be used. Thus, if the frequency of the clock were 12 times the frequency of the input signal, while a majority gate using 3 successive sampled values could be used, it is possible to use a majority gate reading five successive sampled values. This would put out a signal corresponding to the polarity of three out of five. This would provide more effective filtering than a 3-bit majority gate.

Also, as indicated in FIG. 2, the de-modulation of the signal 132, outputted from the latch on lead 130, would be detected or de-modulated at a time T/2 which would be halfway between the sampling times t7 and t9.

The digital majority gate 126 is a standard piece of digital logic apparatus and is available on the market. One model, No. MC 14530B, is manufactured by Motorola Semiconductors Co. of Phoenix, Arizona. All of the other circuit elements of FIG. 3, such as, the receiver, digitizer, clock, shift register, and latch, are well-known in the art and need no further description.

While for the examples shown the clock is synchronized with the received signal, the system will operate even though the synchronization is not provided. Also, the illustrated examples are based on transmitting to the majority gate the last three samples. This method is not so limited since any selected group of samples may be passed to the majority gate, depending on the signal to be filtered and the filtering action desired.

Also, while the strategy of the cited examples was to identify the presence of the positive half cycle of the input signal, a corresponding logic could be set up to identify the presence of the negative half cycle, or for a combination of positive and negative half cycles.

If the signal is a true square wave signal, the separate digitizer 108 is not required, and the lead 106 could be connected to the lead 114. In other words, the square wave 105 would be applied to the shift register, and each pulse of the clock over lead 116 to the shift register would sample the voltage on 106 and load it into the register. In this way the digitization would be accomplished at the input to the shift register.

It will be clear also that when the clock frequency is higher than 8F, such as, say, 12F, it is possible to majority filter the output of the shift register on the basis of 3 sequential bits, or 5 sequential bits.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. The method of filtering high frequency noise pulses from alternating analog data, of a selected frequency F, comprising the steps of:

(a) forming a bi-level or square wave signal from said analog data;

(b) providing a clock signal of a frequency of at least 8F;

(c) sampling said bi-level data at the frequency of said clock signal, and reading said sampled data at clock frequency into a digital shift register;

(d) reading out in parallel from said shift register a selected number of sampled bits, and into a majority gate in selected polarity;

(e) applying the majority signal from said majority gate to a latch in synchronism with said clock signal, whereby the output of said latch will be the digital majority noise filtered version of the input analog signal.

2. The method as in claim 1 including the additional step of detecting the output signal of said latch at a selected time in the cycle of said bi-level signal.

3. The method as in claim 1 in which said clock frequency is 8F and the majority gate reads at least three adjacent digital bits and outputs the polarity of 2 out of 3 sequential bits.

4. The apparatus as in claim 2 in which said selected time in the cycle is in the vicinity of ½ cycle after the start of the positive half of said bi-level signal.

5. The apparatus as in claim 1 in which said clock frequency is 12F and the majority gate reads at least 3 adjacent digital bits.

6. The apparatus as in claim 1 in which said clock frequency is 12F and the majority gate reads at least 5 adjacent digital bits.

7. The method as in claim 1 in which the selected polarity of the sampled bits is positive.

8. The method as in claim 1 in which the selected polarity of the sampled bits is negative.

9. Apparatus for filtering high frequency noise pulses from alternating analog data of a selected frequency F, comprising;

(a) receiver means to convert said analog input data to a bi-level or square wave signal;

(b) clock means to provide a clock signal of a frequency of at least 8F;

(c) means to sample said bi-level or square wave signal at the times of said clock signal, and to apply the stream of sampled signal bits to a digital shift register at the rate of said clock signal;

(d) majority gate means, and means to apply a selected number of sampled bits loaded into said shift register to said majority gate; and (e) means to apply the output of said majority gate to a latch in synchronism with said clock signal.

10. The apparatus as in claim 9 including means to utilize the output signal from said latch.

11. The apparatus as in claim 9 including means to detect the output latch signal at a selected time in the cycle of said bi-level signal.

12. The apparatus as in claim 11 in which said selected time in the cycle is in the vicinity of ½ cycle after the start of the positive half of said bi-level signal.

* * * * *